United States Patent [19]
Gotal et al.

[11] Patent Number: 4,547,712
[45] Date of Patent: Oct. 15, 1985

[54] SUBHARMONIC CONTROLLER FOR ELECTROMAGNETIC EXCITER

[75] Inventors: John D. Gotal, Indiana; Junius D. Scott, Homer City, both of Pa.

[73] Assignee: FMC Corporation, Chicago, Ill.

[21] Appl. No.: 491,481

[22] Filed: May 4, 1983

[51] Int. Cl.⁴ .............................................. H02K 33/14
[52] U.S. Cl. .................................... 318/128; 318/130; 318/132
[58] Field of Search .................. 318/114, 119, 128–132

[56] References Cited

U.S. PATENT DOCUMENTS

| | | | |
|---|---|---|---|
| 3,331,239 | 7/1967 | Larsen et al. | 318/130 X |
| 3,400,316 | 9/1968 | Kuschel | 318/129 X |
| 3,648,136 | 3/1972 | Krajewski et al. | 318/132 X |
| 3,649,893 | 3/1972 | Lajoie | 318/132 X |
| 3,784,930 | 1/1974 | Vosteen et al. | 318/132 X |
| 3,840,789 | 10/1974 | Dion | 318/128 |
| 4,049,997 | 9/1977 | McGhee | 318/128 |
| 4,053,817 | 10/1977 | Yeasting | 318/128 |

Primary Examiner—Donovan F. Duggan
Attorney, Agent, or Firm—Ronald C. Kamp; Richard B. Megley; Douglas W. Rudy

[57] ABSTRACT

A subharmonic controller for a dual coil electromagnetic vibrator, which derives both power and timing from a conventional a.c. line, having a zero crossing detector providing pulses at twice line frequency to a phase control. The phase control provides a selectively variable pulse width and triggers a frequency divider, which in turn triggers a divide-by-two-counter. Pulses from each of the phase control, divider and counter are fed to a logic controller which generates plus and minus gate signals. The gate signals alternately fire a pair of oppositely-directed SCR's, each SCR connected in series with one of the dual coils across the a.c. line. A polarity detector and reset circuit restore the polarity information and synchronize it with the direction of conduction of the SCR's.

10 Claims, 3 Drawing Figures

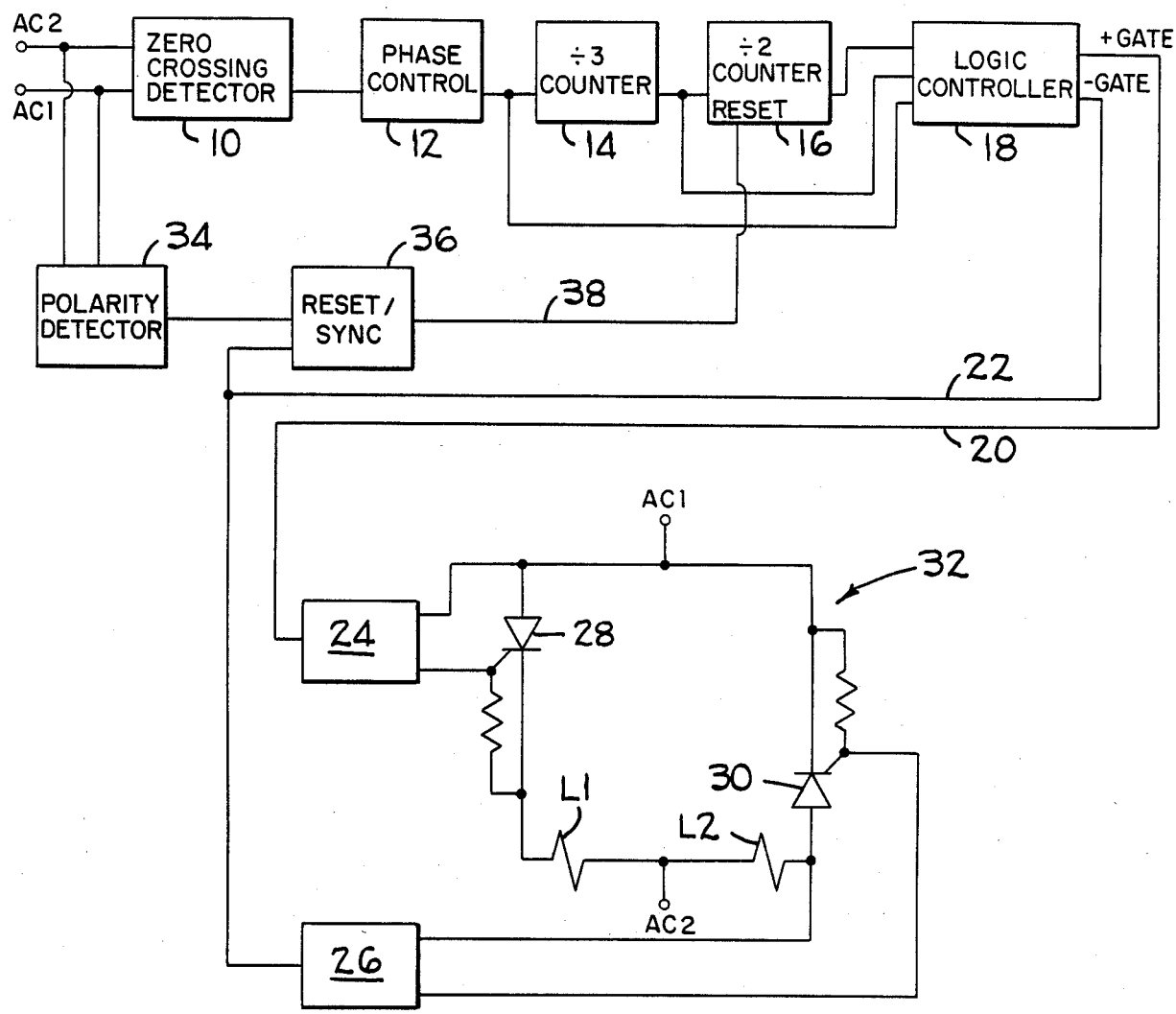
FIG_1

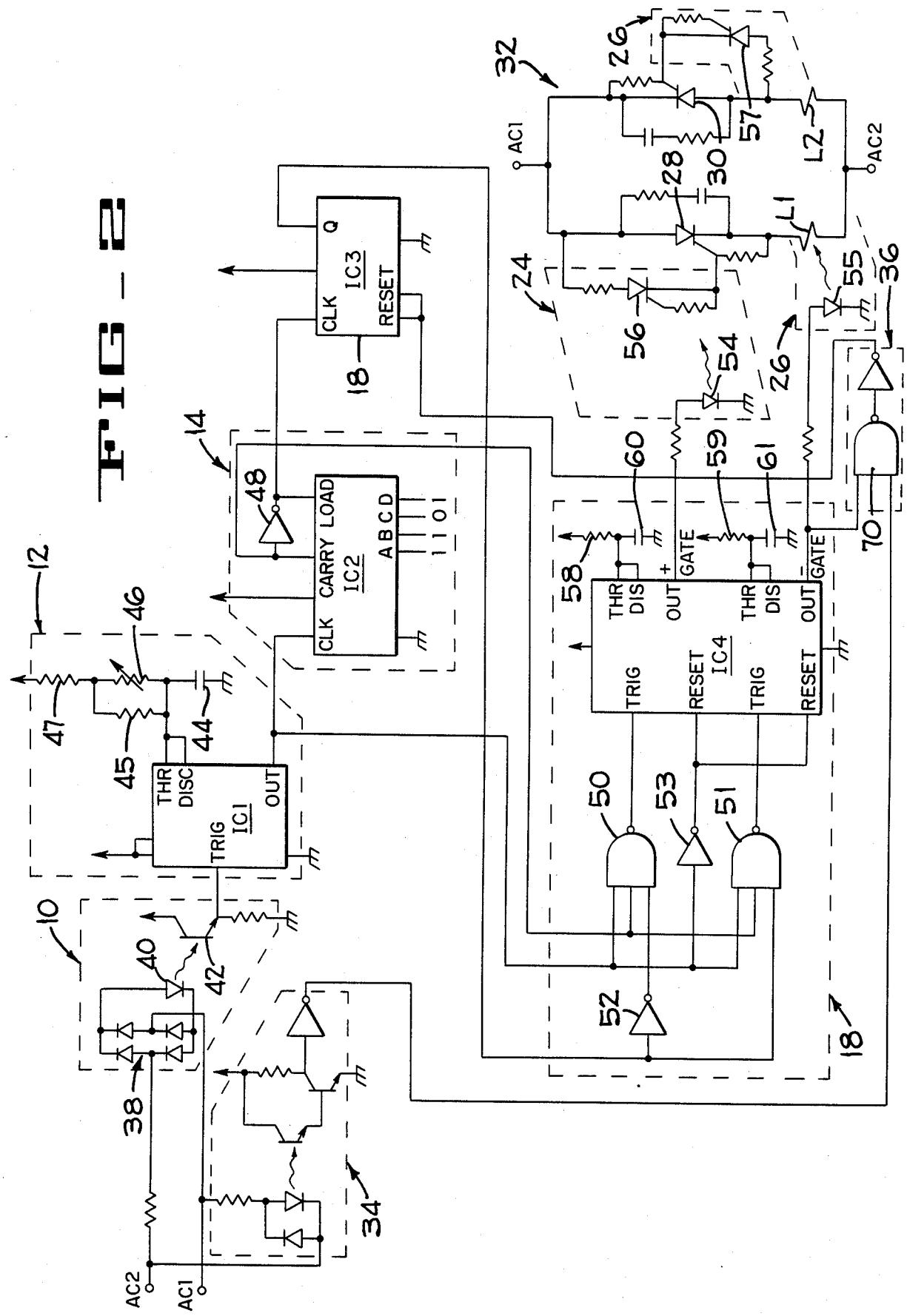
FIG_2

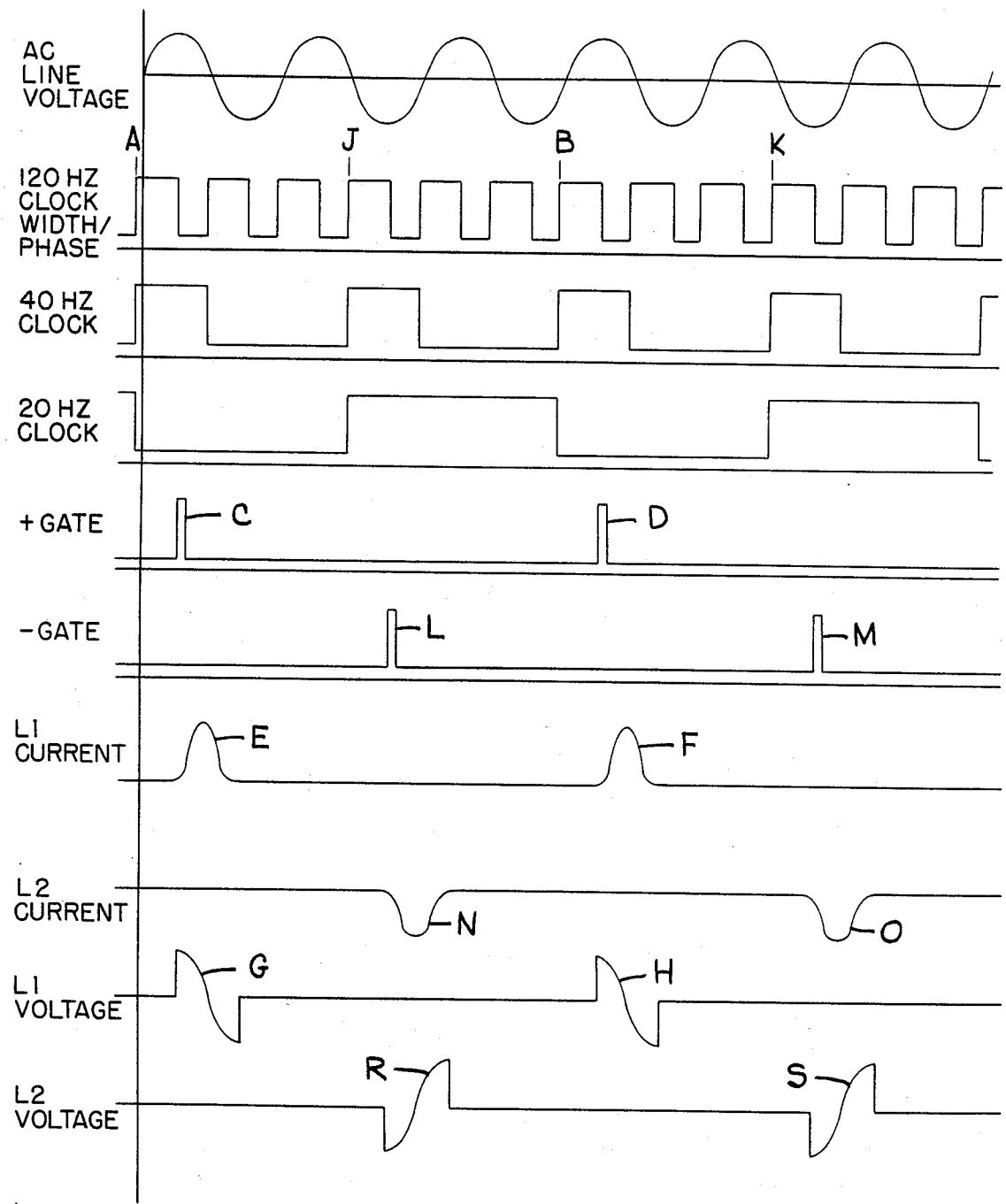
FIG_3

SUBHARMONIC CONTROLLER FOR ELECTROMAGNETIC EXCITER

BACKGROUND AND SUMMARY OF THE INVENTION

Vibratory material handling of large loads requires the use of long strokes applied at a low rate or frequency. These frequencies are significantly lower than those capable of delivery by conventional electromagnet gap motors. The prior art has therefore tended to concentrate on use of mechanical exciters utilizing eccentric weight(s) secured to a shaft rotated by an electric motor. The bearings rotatably mounting the shaft, and the motor armature when directly coupled to this shaft, are subjected to high loads resulting from the oscillating forces created by rotation of the eccentric weight(s), which loads adversely affect the service life of the bearings. In addition, the environment in which the vibratory mechanism must operate is often dusty, or otherwise not conducive to long bearing life, resulting in a further diminution thereof which aggravates the service problems relating to these bearings. Because of the heat generated by the motor, and the fact that its output motion is rotational, shrouding of the motor is difficult and/or very costly. Consequently, the use of such mechanical exciters is generally restricted to environments where exposed electric motors do not represent a hazard.

Electromagnetic vibrators, which do not employ a rotating mass, but instead reciprocate a mass in a straight line motion, have no bearings, obviating the problems associated therewith, and can be completely enclosed or shrouded. However, such vibrators require a controller to supply electric power to an electromagnetic, or preferrably dual opposing magnets which are alternately energized. In order to maximize available stroke amplitudes for the reciprocating mass, static forces acting thereon must be eliminated to the extent possible. This can be achieved by both energizing the electromagnets for an electric conduction period which is of equal time duration and magnitude for each magnet, and synchronizing the magnets to turn on in exact opposite phase to each other.

The present invention provides a controller for an electromagnetic exciter, which controller achieves the above, and which derives both its power and timing from a single phase AC power line and drives each of the dual magnet coils at a frequency which is exactly ⅓ of the power line frequency, with each magnet energized only once per mechanical cycle. While either of the major types of thyristors may be used to drive the magnet coils, Silicon Controlled Rectifiers (SCR) are preferred to triacs on a cost and performance basis, even though the SCR's require a timing train locked into not only the power line subharmonic frequency, but also its polarity. The invention utilizes a division arrangement which allows a variable delay to be inserted into the timing train that permits a wide range of control for the power load applied to the magnets. The invention precludes any imbalance from appearing in the power line due to unequal delays since a single shared device generates the delay for both of the magnet coils. Photon coupled isolators are utilized to prevent noise or other unwanted signals from being introduced into the control circuit.

BRIEF DESCRIPTION OF THE DRAWINGS

FIG. 1 is a block diagram of a controller according to the present invention.

FIG. 2 is a schematic diagram of a digital electronic control circuit illustrating a preferred manner of practicing the invention of FIG. 1.

FIG. 3 is a plurality of wave forms relating to the circuit of FIG. 2 displayed on a common time axis.

DETAILED DESCRIPTION

Referring now to FIG. 1, a single phase alternating current power line is represented by AC 1 and AC 2 and connects with a zero crossing detector 10. This detector 10 is connected to and triggers a phase control 12. The phase control generates a square wave which is twice the frequency of the alternating current appearing across AC 1 and AC 2. Since the usual load line frequency is 60 hertz, the phase control square wave frequency will be 120 hertz. Phase control 12 is also capable of generating a variable time delay between receipt of the trigger signal from the zero crossing detector and the generation of a trigger signal transmitted to a divide-by-three counter 14. The counter 14 receives the signal from the phase control 12 and produces a square wave signal which is ⅓ the frequency generated by the phase control or ⅔ the frequency of the AC line, i.e. 40 hertz. A divide-by-two counter 16 further divides the signal frequency from the divide-by-three counter 14 so that counter 16 produces a square wave signal which is ½ that produced by counter 14, or ⅓ of AC line frequency, i.e. 20 hertz. The output signals from the phase control 12, counter 14 and counter 16 are fed to a logic controller 18 which produces plus and minus gate signals in lines 20 and 22 respectively, which signals are 180 degrees out of phase. The presence of a gate signal in lines 20 and 22 triggers the connected one of the photon coupled isolators 24 and 26 to respectively activate the power SCR's 28 and 30 in a power circuit 32. The power circuit 32 is comprised of two legs connected in parallel, one leg containing SCR 28 and electromagnet coil L1 and the other leg containing SCR 30 and coil L2. The electromagnet coils L1 and L2 are the activating means in an electromagnetic vibratory exciter, such as that disclosed in U.S. patent application, Ser. No. 352,284 filed Feb. 25, 1982, by A. L. Dean, R. E. Kraft and K. E. Marshall for Electromagnetic Vibratory Exciter, for example. The SCR 28 permits current flow from AC1 to AC2 through electromagnet coil L1, while SCR 30 permits current flow from AC2 to AC1 through coil L2. The current flow through the coils creating electromagnetic forces on opposite sides of a reciprocable mass to alternately drive the mass in opposite directions. The gate signal from the photon coupled isolators 24 and 26 need only be sufficiently long to coincide with the current attempting to flow from the anode to cathode of the related SCR to turn that SCR on, after which the conducting SCR will remain on until the current therethrough goes to zero. Stated differently, the control circuit turns the SCRs on, but once on, they are turned off by the absence of current flow in the associated leg of the power circuit 32. When the current flow in the conducting leg of the power circuit goes to zero, the SCR in that leg will turn off.

Since SCRs 28 and 30 are the preferred type of thyristor used in the power circuit 32, there is a need to synchronize the gate signals from the logic control so that the positive half of the current cycle coincides with the positive gate signal and the negative half of the current cycle coincides with the negative gate signal. This is because each of the SCRs will conduct only in one direction and the current half cycle must correspond therewith. The synchronization desired is achieved by connecting a polarity detector 34 to the AC load line AC1 and AC2. The polarity detector signal and the minus gate signal are combined in a reset/sync gate 36 to provide a signal through connection 38 to the reset of counter 16.

Referring now to the detailed schematic of FIG. 2, the zero crossing detector includes four diodes connected between AC1 and AC2 to form a conventional full wave bridge or rectifier 38, the output of which is connected to infra-red light emitting diode 40. A photo transistor 42 is coupled to the LED 40 so that transistor 42 is turned on when light is emitted from the LED 40. The LED 40 and the photo transistor 42 are commercially available in an integrated package identified as 4N 27.

The phase control 12 includes an integrated circuit IC1, which maybe a 555 timer arranged as a one-shot or monostable multivibrator. The negative edge trigger of the timer is activated when the emitter of photo transistor 42 goes to ground, i.e. when the transistor 42 stops conducting, which is when light ceases to be emitted by LED 40, thereby presenting a negative edge for the trigger. The output from the timer goes positive as the trigger input is briefly brought to ground. When the input of the timer is triggered, the discharge-clamp transistor forming a part of the timer is released from the timing capacitor 44. This capacitor then charges through a resistance, which resistance includes resistor 45 connected in parallel with variable resistor 46, which resistors are in turn connected in series with resistor 47, until $\frac{2}{3}$ of the supply voltage is reached. At that instant, a threshold comparator within the timer causes the output to go to ground. The time it takes for the capacitor 44 to charge to $\frac{2}{3}$ of supply voltage is a function of the resistance in the variable resistor 46. Hence, the variable resistor 46 controls the amount of delay between the initial trigger input, when the output goes positive, and the time when the capacitor 44 reaches $\frac{2}{3}$ supply voltage, when the output goes negative. The phase control 12 therefore functions as a pulse generator, but requires an external command to initiate a new time delay. That external command is supplied by the zero crossing detector 10, which produces such a command each time the AC voltage across load lines AC1 and AC2 drops to zero. Since the AC voltage crosses zero twice in each cycle, the output frequency from the phase control 12 will be twice the frequency of the AC supply voltage, namely 120 hertz when AC voltage is 60 hertz. While it is necessary that the trigger pulses be narrower than the output time pulses, such a requirement is easily fulfilled because the trigger pulse will inherently be very narrow. The trigger pulse will last only as long as the LED 40 is not emitting light, which is within a very narrow band on either side of the AC voltage zero point.

The divide-by-three counter 14 includes IC2, which may be a presetable binary (divide 16) counter e.g. a 74161. The clock pin of this counter receives the output from IC1. Since the 74161 integrated circuit triggers on positive edges, the count advances one count each time the clock goes from low to high state. The count therefore advances when the trigger of the timer of IC1 receives a negative edge. The load inputs A, B, C, D of the 74161 are preset with binary 13, i.e. A, B and D high and C low. The count then advances synchronously to binary 14 and 15 on successive positive edge clock pulses. When the count is 15 a high carry signal is produced which is inverted to a low by inverter 48 and fed to the load terminal. When the load terminal is brought to ground, the binary word on load inputs A, B, C, D is entered in parallel into the counter, presetting the counter to binary 13 synchronous with the positive edge of the clock signal. The 74161 IC thus functions as a divide 3 counter because it produces an output signal at its carry terminal for every 3 inputs to the clock. The frequency of the signal out of the carry terminal is therefore $\frac{1}{3}$ of the frequency from IC1.

The signal from the inverter 48 is also fed to the clock input of the divide 2 counter 18, which comprises IC3 and may be a 7492 counter. This counter advances on the negative-going clock edge. Thus, the IC3 advances each time IC2 produces a high carry signal which is coincident with the rising 120 hertz clock signal. The frequency from the Q output of IC3 is $\frac{1}{2}$ of that frequency into the clock, or 20 hertz when the AC line frequency is 60 hertz.

The 120 hertz signal from the timer of IC1 and the 40 hertz signal from the carry terminal of IC2 are fed to two inputs of a three input nand gate 50. The third input to gate 50 is the complement of the 20 Hz clock signal, which signal is inverted by inverter 52. The output of the nand gate 50 is high until all three input signals are positive, at which time the output of nand gate 50 goes low. By reference to FIG. 3, the three input signals to nand gate 50 go high at the time points marked A and B, i.e., the 120 Hz and 40 Hz clocks are high, while the 20 Hz clock is low. However, the reset is connected to the 120 Hz clock through inverter 53. When the 120 Hz clock is high, the reset is low forcing the output of both the + gate and − gate to remain low. Thus, even though the trigger has seen a negative edge, the output cannot go high until the ground has been removed from the reset. When the 120 Hz clock goes low, the ground is removed and the capacitor 60 is thereafter charged through resistor 58, producing the + gate signals C and D. The + gate signals cause the light emitting diode 54 to conduct and emit light. The light thus emitted gates the control SCR 56, which is thereby turned on to provide gate current to the power SCR 28. The coil L1 is thereby energized; the current in L1 represented in FIG. 3 at E and F, and the L1 voltage represented at G and H.

Similarly, the nand gate 51 has three inputs, viz. the 120 Hz, 40 Hz and 20 Hz clock signals. All three signals are high at times J and K, which causes the output from nand gate 51 to go low, thereby triggering the lower trigger of IC4. However, the inverter 53 also provides a ground to the lower reset forcing the − gate low until the 120 Hz clock goes low. At that time, the − gate signal is produced, as shown at L and M in FIG. 3, as the capacitor 61 is charged through resistor 59. The LED 55 conducts during the − gate signal causing light to be emitted to gate the control SCR 57. The control SCR 57 is thereby turned on to provide gate current to the power SCR 30. The power SCR 30 is thus turned on to connect the coil L2 between AC2 and AC1 during the negative portion of the AC line voltage. The current through L2 is represented at N and O in FIG. 3, while the voltage across L2 is represented at R and S. In order to synchronize, the − gate signal with the negative portion of the AC line voltage, the polarity detector 34 provides a low output to the nand gate 70 of the reset/sync gate 36 during the negative portion of the AC line cycle and a high output during the positive portion of the AC line cycle. The − gate signal is also supplied to the nand gate 70. The output from the nand gate is high unless the − gate signal occurs during the positive portion of the AC cycle. When this does occur the output of the nand gate 70 goes low and a reset signal is provided to IC3 to restore the synchronization between the − gate and the negative portion of the AC cycle. The polarity detector 34 and the reset/sync gate 36 restore the polarity information destroyed by the zero crossing detector and assure that only one polarity of current pulse is applied to each electromagnet coil L1 and L2. The magnet losses due to flux reversal are thereby eliminated and the efficiency of the exciter is improved.

It will be seen from the foregoing description that the present invention provides a controller which derives both power and timing from a single AC line, and which drives two magnet coils at a frequency exactly one-third of the power line frequency. Each magnet is energized only once per mechanical cycle, which is also one third of the power line frequency, the magnet coils being turned off 180° apart in the mechanical cycle as a natural consequence of the frequency division method. The one-third frequency division is uniquely advantageous because the direct current component in the AC line is canceled and peak currents are minimized. This frequency division arrangement allows delay to be inserted in the timing chain in order to achieve a wide range in control of the power level to the magnet coils. Only one adjustable resistor is needed to control the delay in both the positive and negative portion of each cycle so no imbalance appears on the power line due to unequal delays. It is important that the timer of phase control 12 be incapable of being retriggered until it has timed out. Its minimum time period is slightly greater than the low state of the zero crossing detector 10. The timer of phase control 12 must fall before the next zero crossing pulse to maintain the timing constraints. This can be achieved by proper selection of values for the capacitor 44 and resistors 45 and 47.

While a preferred embodiment of the present invention has been illustrated and described herein, it will be appreciated that various changes and modifications may be made therein without departing from the spirit of the invention as defined by the scope of the appended claims.

What is claimed is:

1. Controller for an electomagnetic exciter operating from a single phase alternating current source, comprising:
    first and second electromagnet coils;
    first and second thyristors, connected in series with said first and second coils respectively, each thyristor of opposite polarity from the other;
    control circuit means for producing a first plus and a second minus gate signal; and
    optoelectronic means for isolating said first thyristor from said first plus gate signal and isolating said second thyristors from said second minus gate signal, said optoelectronic means for activating said first and second thyristors only in response to said plus and minus gate signals respectively.

2. The invention according to claim 1 wherein said control circuit means comprises:
    zero crossing detector means;
    phase control means connected to said zero crossing detector;
    counter means for dividing the frequency output from said phase control; and
    logic controller means responsive to the signals from said phase control and counter means to create said plus and minus gate signals.

3. A subharmonic controller for an electromagnetic vibrator having a first coil operating on a single phase a.c. line comprising:
    a zero crossing detector capable of generating a first pulse as the a.c. line voltage crosses zero;
    a monostable multivibrator capable of receiving said pulse and generating a pulse width;
    a frequency divider triggered by the output from said multivibrator capable of producing second pulses at a fraction of the a.c. line frequency;
    a divide-by-two counter triggered by the output from said divider for producing third pulses at one-half the frequency of the output from said divider;
    a logic controller having input from each of said multivibrator, divider and counter for producing a polarized gate signal;
    a thyristor in series with said coil across said a.c. line; and
    means responsive to said gate signal for firing said thyristor.

4. The invention according to claim 3, wherein said thyristor is an SCR.

5. The invention according to claim 4, and further comprising:
    a polarity detector connected to said a.c. line; and
    a reset/synchronizer for receiving the output from said polarity detector and the input to said means for firing and connected to said counter to synchronize the polarity with the direction of conduction of said SCR.

6. A subharmonic controller for a dual coil electromagnetic vibrator in which both power and timing therefor are derived from a single a.c. line, comprising;
    a zero crossing detector capable of generating a pulse at twice the frequency of the a.c. line;
    a monostable multivibrator connected to receive said pulse and generate a selectively variable pulse width;
    a frequency divider triggered by the output from said multivibrator to produce second pulses at a fraction of the a.c. line frequency;
    a divide-by-two counter triggered by the output from said divider to produce third pulses at one-half the frequency of the output from said divider;
    a logic controller connected to the output from each of said multivibrator, divider and counter to produce plus and minus gate signals;
    a pair of SCR's, each connected in series with one of said dual coils across the a.c. line; and
    means responsive to said gate signals for firing said SCR's.

7. The invention according to claim 6, and further comprising;
    a polarity detector connected to said a.c. line; and
    a reset/synchronizer for receiving the output from said polarity detector and the input to said means for firing and connected to said counter to correlate the plus and minus gate signals with the direction of conduction of each SCR.

8. The invention according to claim 7, wherein said means for firing comprises photon coupled isolators.

9. The invention in accordance with claim 3, wherein said thyristor is a triac.

10. A controller for an electromagnetic exciter operating from a single phase alternating current source, comprising first and second electromagnet coils;

first and second thyristors, connected in series with said first and second coils respectively;

control circuit means for producing plus and minus gate signals comprising a zero crossing detector means, phase control means receiving an input signal from said zero crossing detector means, counter means for dividing the frequency output from said phase control, and logic controller means responsive to the signals from said phase control and counter means to create said plus and minus gate signals; and means for activating said first and second thyristors only in response to said plus and minus gate signals respectively.

* * * * *